US011679943B2

(12) United States Patent
Orsila et al.

(10) Patent No.: US 11,679,943 B2
(45) Date of Patent: Jun. 20, 2023

(54) APPARATUS AND METHOD FOR STACKING AND COATING OF VERY SHORT CAVITY LASER DIODE ARRAYS

(71) Applicant: Modulight Corporation, Tampere (FI)

(72) Inventors: Lasse Orsila, Tampere (FI); Antti Saarela, Tampere (FI)

(73) Assignee: Modulight Corporation, Tampere (FI)

( * ) Notice: Subject to any disclaimer, the term of this patent is extended or adjusted under 35 U.S.C. 154(b) by 0 days.

(21) Appl. No.: 17/473,005

(22) Filed: Sep. 13, 2021

(65) Prior Publication Data
US 2023/0081770 A1    Mar. 16, 2023

(51) Int. Cl.
*B65G 57/00* (2006.01)
*H01S 5/40* (2006.01)
(52) U.S. Cl.
CPC .......... *B65G 57/005* (2013.01); *H01S 5/4025* (2013.01)
(58) Field of Classification Search
CPC ..... B65G 57/005; H01S 5/4025; H01L 21/00; H01L 21/673; H01L 21/687; H01L 21/68; H01L 21/70; H01L 21/77
USPC ............................................. 414/802; 269/77
See application file for complete search history.

(56) References Cited

U.S. PATENT DOCUMENTS

| 6,240,116 | B1 | 5/2001 | Lang et al. | |
| 6,295,307 | B1 * | 9/2001 | Hoden | H01S 5/02365 |
| | | | | 372/36 |
| 7,268,005 | B2 * | 9/2007 | Chen | H01S 5/4025 |
| | | | | 372/75 |
| 10,707,652 | B1 | 7/2020 | Tazzoli et al. | |
| 2008/0277852 | A1 * | 11/2008 | Kellerson | B23Q 3/103 |
| | | | | 269/95 |

OTHER PUBLICATIONS

Notification of Transmittal of The International Search Report and The Written Opinion of The International Searching Authority, or The Declaration, Application No. PCT/FI2022/050500, dated Oct. 27, 2022, 10 pages.

* cited by examiner

*Primary Examiner* — Lynn E Schwenning
(74) *Attorney, Agent, or Firm* — Ziegler IP Law Group

(57) ABSTRACT

An apparatus for stacking and coating of very short cavity laser diode arrays. The apparatus includes an array holder fixture to securely hold the very short cavity laser diode arrays and spacer arrays, and a stacking plate. The array holder fixture including a top-side presser to secure a stack of very short cavity laser arrays and spacer arrays from a first end of the stack, a bottom-side presser to secure the stack of very short cavity laser arrays and spacer arrays from a second end of the stack, and a pair of side clamps. The array holder fixture is operatively coupled to the stacking plate during the stacking of the very short cavity laser diode arrays and spacer arrays.

10 Claims, 11 Drawing Sheets

APPARATUS AND METHOD FOR STACKING AND COATING OF VERY SHORT CAVITY LASER DIODE ARRAYS

TECHNICAL FIELD

The present disclosure relates generally to manufacturing and coating of laser diode arrays; and more specifically, to apparatus and methods for stacking and coating of very short cavity laser diode arrays.

BACKGROUND

Laser diode arrays are a combination of multiple individual semiconductor laser diode devices processed into a single piece of semiconductor to form a lateral array of emitters with parallel beams. Furthermore, such laser diode arrays are used in many applications from optical communications to printing, display, and different illumination and pumping applications. In some applications, very short optical cavities are desired to realize different performance parameters for each device that may be related for example to switching speed, operating power or overall power consumption of the device. Therefore, this becomes very important in applications where the application benefits from the laser diode array with a very high density and/or large number of laser diodes and power consumption is of concern like high-speed digital press or quantum computing.

To accurately coat laser diode arrays, one has to account for the shadowing effect, wherein shadowing effect prevents the coating of same thickness to be applied throughout the laser diode arrays. However, bar stacks cannot be stacked so evenly that shadowing would not occur. Thus, a small gap is incorporated between the laser arrays, often through implementation of spacer bars. Herein, the small gap allows facets of the laser diode arrays to be fully coated without the shadowing effect. However, this approach does not work in case when processed bumps are used to create the gap in the laser array. Then the p- and n-sides of the laser may be completely covered with a coating material that will damage the electrical contacts of the component. Furthermore, the presence of extra steps makes the approach cumbersome and in case anything goes wrong, coating of the laser bars might be fully prevented. Additionally, vacuum assisted laser bars stacking may be performed, but then only a particular vacuum line needs to be used, thereby making stacking process of the laser diode arrays more complex.

Therefore, in light of the foregoing discussion, there exists a need to overcome the aforementioned drawbacks associated with conventional methods for coating of laser bars.

SUMMARY

The present disclosure seeks to provide an apparatus for stacking and coating of very short cavity laser diode arrays. The present disclosure also seeks to provide a method for stacking and coating of very short cavity laser diode arrays. An aim of the present disclosure is to provide a solution that overcomes at least partially the problems encountered in prior art.

In one aspect, the present disclosure provides an apparatus for stacking and coating of very short cavity laser diode arrays, the apparatus comprising
an array holder fixture to securely hold the very short cavity laser diode arrays and spacer bars between consecutive very short cavity laser diode arrays, the array holder fixture comprising
a top-side presser to secure a stack of very short cavity laser diode arrays and spacer bars from a first end of the stack,
a bottom-side presser to secure the stack of very short cavity laser diode arrays and spacer bars from a second end of the stack, and
a pair of side clamps detachably attached to sides of the array holder fixture, wherein the pair of side clamps are attached after stacking of the very short cavity laser diode arrays and the spacer bars; and
a stacking plate, wherein the array holder fixture is operatively coupled to the stacking plate during the stacking of the very short cavity laser diode arrays and spacer bars.

In another aspect, the present disclosure provides a method for stacking and coating of very short cavity laser diode arrays using the apparatus, the method comprising:
placing an array holder fixture on a stacking plate;
lifting the array holder fixture and the stacking plate to enable stacking;
stacking the very short cavity laser diode arrays and spacer bars between consecutive very short cavity laser diode arrays;
inserting a pair of side clamps at the sides of the array holder fixture to secure the stack of very short cavity laser diode arrays and spacer bars;
securing the stack of very short cavity laser diode arrays and spacer bars using the top-side presser;
securing the stack of very short cavity laser diode arrays and spacer bars using the bottom-side presser;
lifting the stack of very short cavity laser diode arrays and spacer bars from the stacking plate after completing the stacking of very short cavity laser diode arrays and spacer bars; and
tightening the pair of side clamps using screws thereof.

Embodiments of the present disclosure substantially eliminate or at least partially address the aforementioned problems in the prior art, and enable efficient stacking of the very short cavity laser diode arrays.

Additional aspects, advantages, features and objects of the present disclosure would be made apparent from the drawings and the detailed description of the illustrative embodiments construed in conjunction with the appended claims that follow.

It will be appreciated that features of the present disclosure are susceptible to being combined in various combinations without departing from the scope of the present disclosure as defined by the appended claims.

BRIEF DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure is not limited to specific methods and instrumentalities disclosed herein. Moreover, those skilled in the art will understand that the drawings are not to scale. Wherever possible, like elements have been indicated by identical numbers.

Embodiments of the present disclosure will now be described, by way of example only, with reference to the following diagrams wherein:

FIGS. 1A, 1B and 10 illustrate different views of an apparatus for stacking of very short cavity laser diode arrays, in accordance with an embodiment of the present disclosure;

Figure 1A:
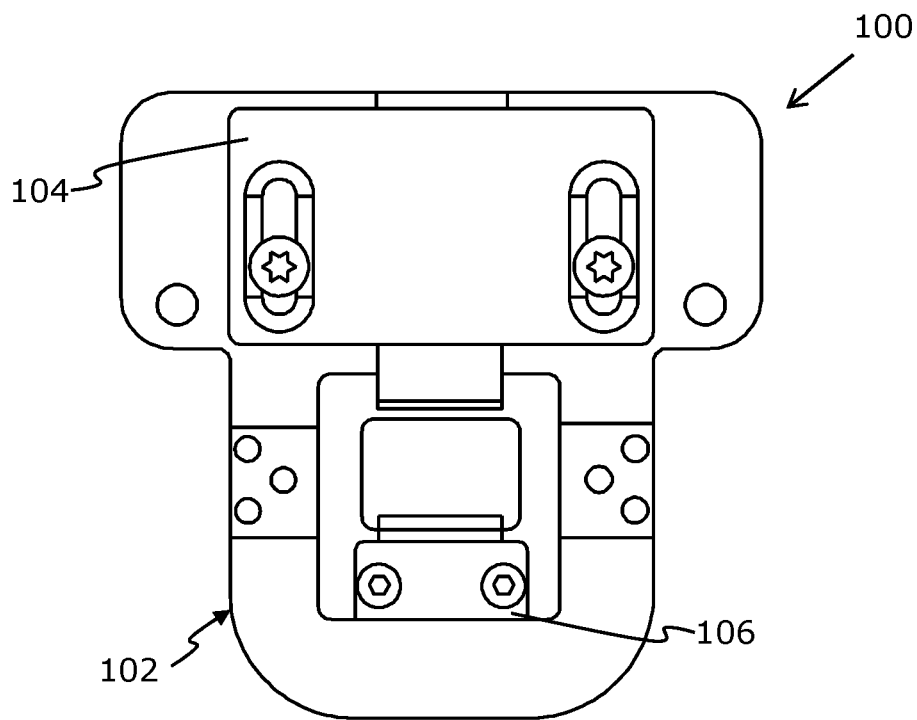

In the accompanying drawings, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing.

DETAILED DESCRIPTION OF EMBODIMENTS

The following detailed description illustrates embodiments of the present disclosure and ways in which they can be implemented. Although some modes of carrying out the present disclosure have been disclosed, those skilled in the art would recognize that other embodiments for carrying out or practicing the present disclosure are also possible.

In one aspect, an embodiment of the present disclosure provides an apparatus for stacking and coating of very short cavity laser diode arrays, the apparatus comprising an array holder fixture to securely hold the very short cavity laser diode arrays and spacer bars between consecutive very short cavity laser diode arrays, the array holder fixture comprising a top-side presser to secure a stack of very short cavity laser diode arrays and spacer bars from a first end of the stack, a bottom-side presser to secure the stack of very short cavity laser diode arrays and spacer bars from a second end of the stack, and a pair of side clamps detachably attached to sides of the array holder fixture, wherein the pair of side clamps are attached after stacking of the very short cavity laser diode arrays and the spacer bars; and a stacking plate, wherein the array holder fixture is operatively coupled to the stacking plate during the stacking of the very short cavity laser diode arrays and spacer bars.

In another aspect, an embodiment of the present disclosure provides a method for stacking and coating of very short cavity laser diode arrays using the apparatus, the method comprising:

placing an array holder fixture on a stacking plate;

lifting the array holder fixture and the stacking plate to enable stacking;

stacking the very short cavity laser diode arrays and spacer bars between consecutive very short cavity laser diode arrays;

inserting a pair of side clamps at the sides of the array holder fixture to secure the stack of very short cavity laser diode arrays and spacer bars;

securing the stack of very short cavity laser diode arrays and spacer bars using the top-side presser;

securing the stack of very short cavity laser diode arrays and spacer bars using the bottom-side presser;

lifting the stack of very short cavity laser diode arrays and spacer bars from the stacking plate after completing the stacking of very short cavity laser diode arrays and spacer bars; and tightening the pair of side clamps using screws.

Pursuant to the embodiments of the present disclosure, the apparatus and method described herein aims to ease stacking and coating of very short cavity laser diode arrays. Notably, the present disclosure enables unique stacking of very short cavity laser diode arrays of less than 300 micrometres. Furthermore, the method of stacking as described in the present disclosure helps prevent shadowing effect while coating the stack. Moreover, design of the apparatus achieves the capability to stack the very short cavity laser diode arrays without complicated parts or vacuum lines. Additionally, the apparatus is thin in nature, hence the apparatus may be used in production with equipment comprising load lock system.

Throughout the present disclosure, the term "very short cavity laser diode arrays" refers to a combination of multiple semiconductor laser diode devices processed into a single piece of semiconductor to form a lateral array of emitters with parallel beams. Herein, the very short cavity laser diode arrays comprise laser diodes, wherein the very short cavity laser diode arrays are stacks of individual or multistrip laser diodes. Furthermore, the laser diode is a semiconductor device similar to a light-emitting diode in which the laser diode which is pumped directly with electrical current creates lasing conditions at the junction of the laser diode. Typically, the laser diodes directly convert electrical energy into light. Additionally, the very short cavity laser diode arrays operate in the wavelength region in a range from 600 nanometres (nm) to 1600 nm. The wavelength range of the very short cavity laser diode arrays may for example be from 600, 800, 1000, 1200 or 1400 nm up to 800, 1000, 1200, 1400 or 1600 nm. Typically, semiconductor laser diodes may operate in a wavelength range from 380 nm up to 2500 nm. The wavelength range of the semiconductor laser diodes may for example be from 380, 780, 1180, 1580 or 2080 nm up to 780, 1180, 1580, 2080 nm or 2500 nm. Moreover, emission bandwidth of the very short laser bar is typically several nanometres. Notably, the dimensions of the very short cavity laser diode arrays may be 110 micrometres in thickness and 8.5 millimetres in breadth. Furthermore, the very short cavity laser diode arrays comprise a short cavity, wherein the short cavity of the very short cavity laser diode arrays may have a length of the short cavity width of 200 micrometres. Herein, the short cavity in the very short cavity laser diode arrays is a means of optical confinement intended to increase gain length of radiation prior to emission from the laser bars.

The apparatus comprises an array holder fixture to securely hold the very short cavity laser diode arrays and spacer bars between consecutive very short cavity laser diode arrays. Herein, the array holder fixture is used for mounting of the very short cavity laser diode arrays and spacer bars. Furthermore, the width of the array holder fixture may lie in a range from 5 millimetres up to 6 millimetres. The width of the array holder fixture may for example be from 5.0, 5.2, 5.4, 5.6 or 5.8 millimetres up to 5.2, 5.4, 5.6, 5.8 or 6.0 millimetres. Furthermore, the array holder fixture is compatible with most load lock systems. Herein, load lock systems are vacuum chambers used as loading devices for semiconductor wafers. Moreover, the array holder fixture is used as a stable holder for the mounting of the very short cavity laser diode arrays and spacer bars. Additionally, the array holder fixture enables uniquely dense stacking of very short cavity laser diode arrays, wherein the size of the very short cavity laser diode arrays are less than 300 micrometres. Herein, the term "spacer bars" refers to sacrificial bars of silicon or same or similar semiconductor material between the very short cavity laser diode arrays. Beneficially, the spacer bars provide mechanical stability when the array holder fixture securely holds the very short cavity laser diode arrays and spacer bars. Furthermore, the spacer bars further hold the very short cavity laser diode arrays securely in the array holder fixture. Additionally, the spacer bars help keep the very short cavity laser diode arrays separate from each other. Herein, the size of the spacer bars may lie in a range from 110 micrometres up to 150 micrometres. The size of the spacer bars may for example be from 110, 118, 128, 138 or 148 micrometres up to 115, 118, 128, 138, 148 or 150 micrometres. Subsequently, the dimensions of the spacer bars may be about 265 micrometres in length and 17 millimetres in breadth. Moreover, the array holder fixture with spacer bars enables controllable overspray without requirement of any special tools, such as vacuum lines or special machining.

Optionally, the array holder fixture comprises at least one back plate to reduce space behind the stack of very short cavity laser diode arrays and spacer bars during coating. Herein, at least one back plate is used in case back reflections of the stack of very short cavity laser diode arrays and spacer bars occur. Furthermore, the back reflections may severely affect coating on rear facet of the apparatus. Hence, at least one back plate may be used to reduce gap between the rear facet and the back of the array holder fixture that the back reflections during coating of the stack of very short cavity laser diode arrays and spacer bars does not affect facet of the array holder fixture.

The array holder fixture comprises a top-side presser to secure a stack of very short cavity laser diode arrays and spacer bars from a first end of the stack. Herein, the top-side presser is used to tighten the stack of very short cavity laser diode arrays and spacer bars from the first end of the stack. Furthermore, the top-side presser is used to apply a direct force to the stack of very short cavity laser diode arrays and spacer bars.

The array holder fixture comprises a bottom-side presser to secure the stack of very short cavity laser diode arrays and spacer bars from a second end of the stack. Additionally, the bottom-side presser is used to equalise tension of the stack of very short cavity laser diode arrays and spacer bars with respect to ends of the spacer bars of the very short cavity laser diode arrays and spacer bars. Herein, the bottom-side presser comprises cavities, wherein the cavities comprise small springs that is used to tighten the stack of very short cavity laser diode arrays and spacer bars with the help of retaining screws. Thereafter, the retaining screws of the bottom-side pressure may be carefully opened allowing a small amount of movement in the bottom-side pressure after attachment of the top-side presser. Notably, the retaining screws are tightened to a specific position thereby tightening the bottom-side presser screws. The bottom-side presser typically squeezes the stack of very short cavity laser diode arrays and spacer bars with a force to close the presser screws of the bottom-side presser, wherein the force applied by the bottom-side presser may be in a range from 2 Newtons up to 4 Newtons. The force applied by the bottom-side presser may for example be from 2.0, 2.5, 3.0 or 3.5 Newtons up to 2.5, 3.0, 3.5 or 4.0 Newtons. Additionally, the small springs may be used to correct small irregularities during stacking.

The array holder fixture comprises a pair of side clamps detachably attached to sides of the array holder fixture, wherein the pair of side clamps are attached after stacking of the very short cavity laser diode arrays and the spacer bars. Herein, after stacking of the very short cavity laser diode arrays and the spacer bars, the stack of very short cavity laser diode arrays and spacer bars are secured by inserting the pair of side clamps. Furthermore, the pair of side clamps are carefully lifted into place using tweezers so as to not break the stack of very short cavity laser diode arrays and spacer bars. Additionally, the pair of side clamps comprises screws which may be lifted with the help of the tweezers and gently screwed and are not tightened fully. In case, the stack of very short cavity laser diode arrays and spacer bars seem firm and straight, the pair of side clamps are fully screwed in using a very little force.

Optionally, a plurality of empty spaces are present on the pair of side clamps for insertion of metal rods therein, wherein the metal rods guide the pair of side clamps into place during the stacking. Herein, the metal rods are inserted to adjust the pair of side clamps by using side guides to help the metal rods guide the pair of side clamps into place during stacking of the very short cavity laser diode arrays and spacer bars. Furthermore, the metal rods are used in conjunction with the array holder fixture. Additionally, the pair of side clamps are positioned in such a way so as to customize the shape of the stack of very short cavity laser diode arrays and spacer bars. Typically, the insertion of metal rods therein helps to secure the spacer bars in position on the array holder fixture.

The apparatus comprises a stacking plate, wherein the array holder fixture is operatively coupled to the stacking plate during the stacking of the very short cavity laser diode arrays and spacer bars. Herein, the stacking plate is used throughout the duration of the stacking of the very short cavity laser diode arrays and the spacer bars. Additionally, the stacking plate is slightly tapped during stacking of the very short cavity laser diode arrays and spacer bars, to let the spacer bars slide better into place due to vibrations. Furthermore, the stack of very short cavity laser diode arrays and spacer bars may be securely lifted from the stacking plate after completion of stacking.

Optionally, the array holder fixture and the stacking plate are liftable by an angle to insert the very short cavity laser diode arrays and the spacer bars and is secured using presser screws. Herein, the angle by which the array holder fixture and the stacking plate are liftable is a small angle of about 10 degrees in order to ease the stacking process, thereby effectively preventing the stack of very short cavity laser diode arrays and spacer bars from crashing during stacking. Furthermore, the top-side presser is secured with the help of the presser screws available in the top-side presser after lifting the array holder fixture and stacking plate by the small angle. Subsequently, the presser screws are opened and gently guided with the help of a finger. Herein, the top-side presser is guided so that the top-side presser can be laid on top of the stack of very short cavity laser diode arrays and spacer bars. Additionally, a steady gentle pressure is applied to the top-side presser and the stacking plate. Herein, the presser screws of the top-side presser are tightened so that the top-side presser is locked securely in place. In an event the top-side presser is locked in too tightly, the stack of very short cavity laser diode arrays and spacer bars may bulge or there might be some deformation in the stack of very short cavity laser diode arrays and spacer bars. Furthermore, in case the stack of very short cavity laser diode arrays and spacer bars is not tightened properly, the top-side presser will not be able to touch the stack of very short cavity laser diode arrays and spacer bars, thereby loosening the stack further.

Optionally, the spacer bars are arranged on the stacking plate to hold the very short cavity laser diode arrays, that are positioned perpendicular to the stacking plate. Herein, the stacking of very short cavity laser diode arrays and spacer bars is performed by inserting the spacer bar at the bottom. Thereafter, the very short cavity laser diode arrays and spacer bars are inserted alternatively. Furthermore, the spacer bars may be inserted to the stack of very short cavity laser diode arrays and spacer bars by keeping the spacer bars a few millimetres away from the stack of the very short cavity laser diode arrays and the space bars and gently pushed into place with the help of tweezers.

Optionally, the stacking plate comprises a pair of pedestals having varying heights to align the array holder fixture thereon, wherein the array holder fixture comprises a pair of corresponding grooves for aligning with the pair of pedestals. Furthermore, the array holder fixture is assembled from separately machined part built from stainless-steel. Hence, tolerance and sizes of the separately machined parts vary in the order of few tens of micrometres. Additionally, the variation of tolerances and sizes are enough to cause a significant mismatch during positioning of the very short cavity laser diode arrays with respect to the spacer bars. Hence, the stacking plate comprises a pair of pedestals comprising varying heights to calibrate the array holder fixture. Herein, the calibration of the array holder fixture is performed with respect to an equivalent stacking plate to determine optimal positioning of the very short cavity laser diode arrays.

Optionally, a carrier plate is used for coating the stack of very short cavity laser diode arrays and spacer bars, wherein the apparatus is arranged on the carrier plate during the coating of the stack. The carrier plate may be, for example, a flat, thin and round metal plate with recesses into which the holder can be fastened with screws. The carrier plate can then be attached inside the coating device during coating. Herein, the stack of very short cavity laser diode arrays and spacer bars is coated with a metal and or dielectric material to adjust reflectivity of the very short cavity laser diode arrays for optimal operation for required application. Furthermore, the stack of very short cavity laser diode arrays and spacer bars are coated in order to prevent impending damage to the stack in the form of, but not limited to, optical or chemical damage. Additionally, the coating provides electrical insulation to the stack of very short cavity laser diode arrays and spacer bars. Notably, the array holder fixture is attached to the carrier plate for the coating procedure of very short cavity laser diode arrays. Additionally, any dust on the carrier plate is gently blown away with the help of nitrogen gas. Thereafter, after coating both sides of the stack of very laser bars and spacer bars using the carrier plate, the array holder fixture is detached from the carrier plate. Furthermore, the stack of very short cavity laser diode arrays and spacer bars can be opened by loosening the pair of side clamps and the presser screws. Additionally, the coated very short cavity laser diode arrays may be collected in a gel box. Moreover, the bottom-side presser comprises contact points, wherein the contact points are small and sharp to avoid shadowing effect during coating. Herein, shadowing effect prevents conformal coating of the stack of very short cavity laser diode arrays and spacer bars, wherein conformal coating refers to coating of same thickness of the stack of very short cavity laser diode arrays and spacer bars.

The present disclosure also relates to the method as described above. Various embodiments and variants disclosed above apply mutatis mutandis to the method.

Optionally, the method comprises lifting the array holder fixture and the stacking plate by an angle to insert the very short cavity laser diode arrays and the spacer bars and securing using presser screws.

Optionally, the method comprises positioning the spacer bars on the stacking plate to hold the very short cavity laser diode arrays, that are positioned perpendicular to the stacking plate consecutively.

Optionally, the method comprises using a carrier plate for coating the stack of very short cavity laser diode arrays and spacer bars.

Optionally, the method comprises using at least one back plate to reduce space behind the stack of very short cavity laser diode arrays and spacer bars during coating.

DETAILED DESCRIPTION OF THE DRAWINGS

Figure 1B:
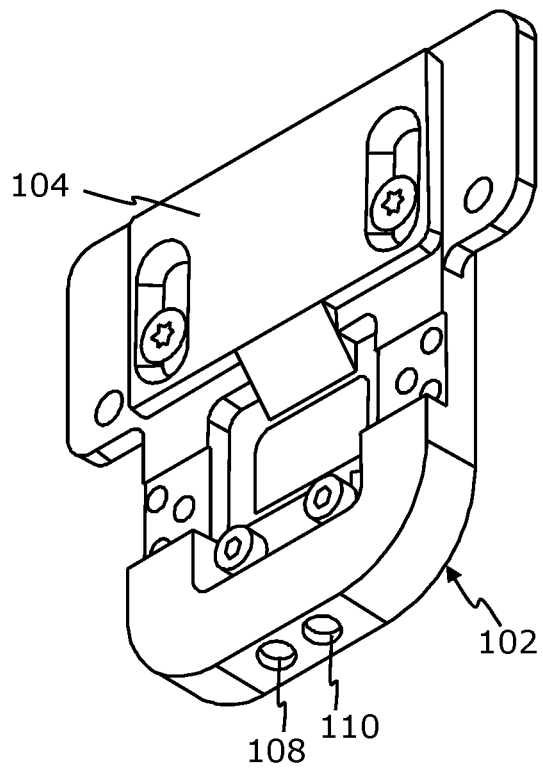
Figure 1C:
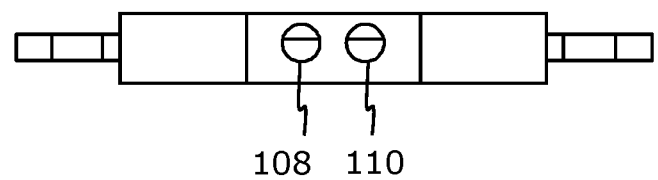
Figure 4:
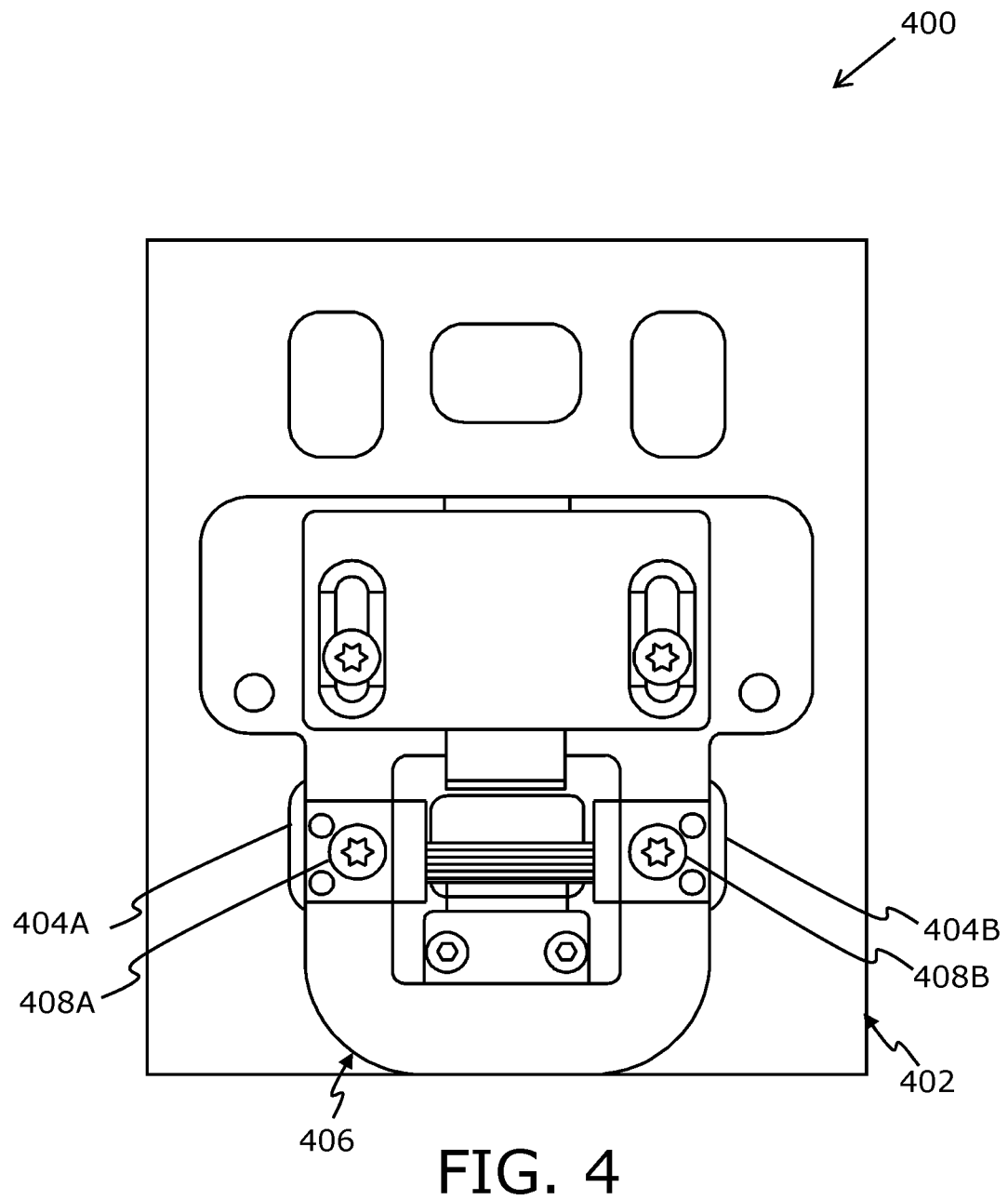
FIG. 4 illustrates an apparatus during stacking of very short cavity laser diode arrays, in accordance with an embodiment of the present disclosure.

Referring to FIGS. 1A, 1B and 1C illustrated are different views of an apparatus 100 for stacking of very short cavity laser diode arrays, in accordance with an embodiment of the present disclosure. In FIG. 1A, there is shown a top view of the apparatus 100. FIGS. 1B and 1C illustrate perspective view and side view of the apparatus 100. The apparatus 100 comprises an array holder fixture 102. The array holder fixture 102 comprises a top-side presser 104, a bottom-side presser 106 and a pair of side clamps (as shown in FIG. 4). The array holder fixture 102 further comprises plurality of cavities, namely a first cavity 108 and a second cavity 110 which goes all the way to the bottom-side presser 106. The apparatus 100 comprises a stacking plate (as shown in FIG. 2), wherein the array holder fixture is operatively coupled to the stacking plate during the stacking of the very short cavity laser diode arrays and spacer bars.

Figure 2:
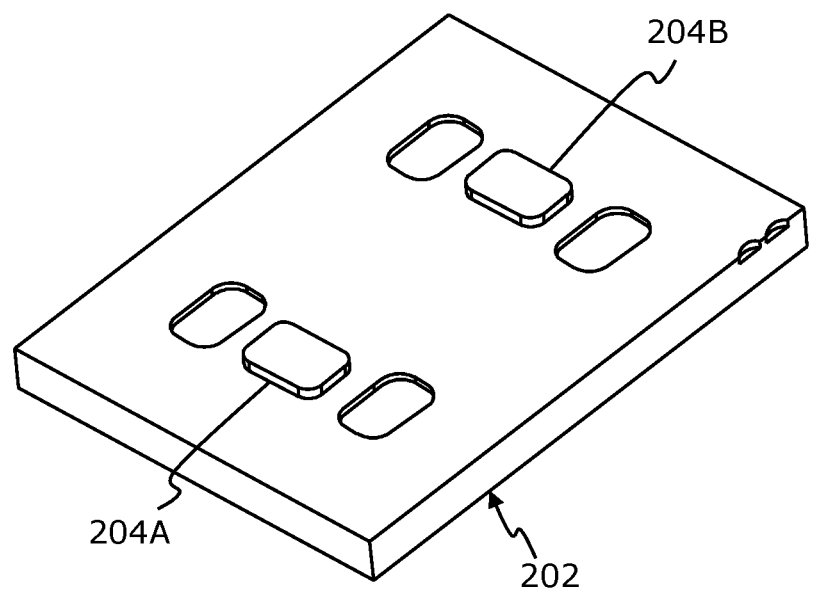
FIG. 2 illustrates a perspective view of stacking plate for stacking of very short cavity laser diode arrays, in accordance with an embodiment of the present disclosure.

Referring to FIG. 2, there is shown a perspective view of stacking plate 202 for stacking of very short cavity laser diode arrays, in accordance with an embodiment of the present disclosure. Herein, the stacking plate 202 comprises a pair of pedestals 204A and 204B having varying heights to align the array holder fixture thereon.

Figure 3:
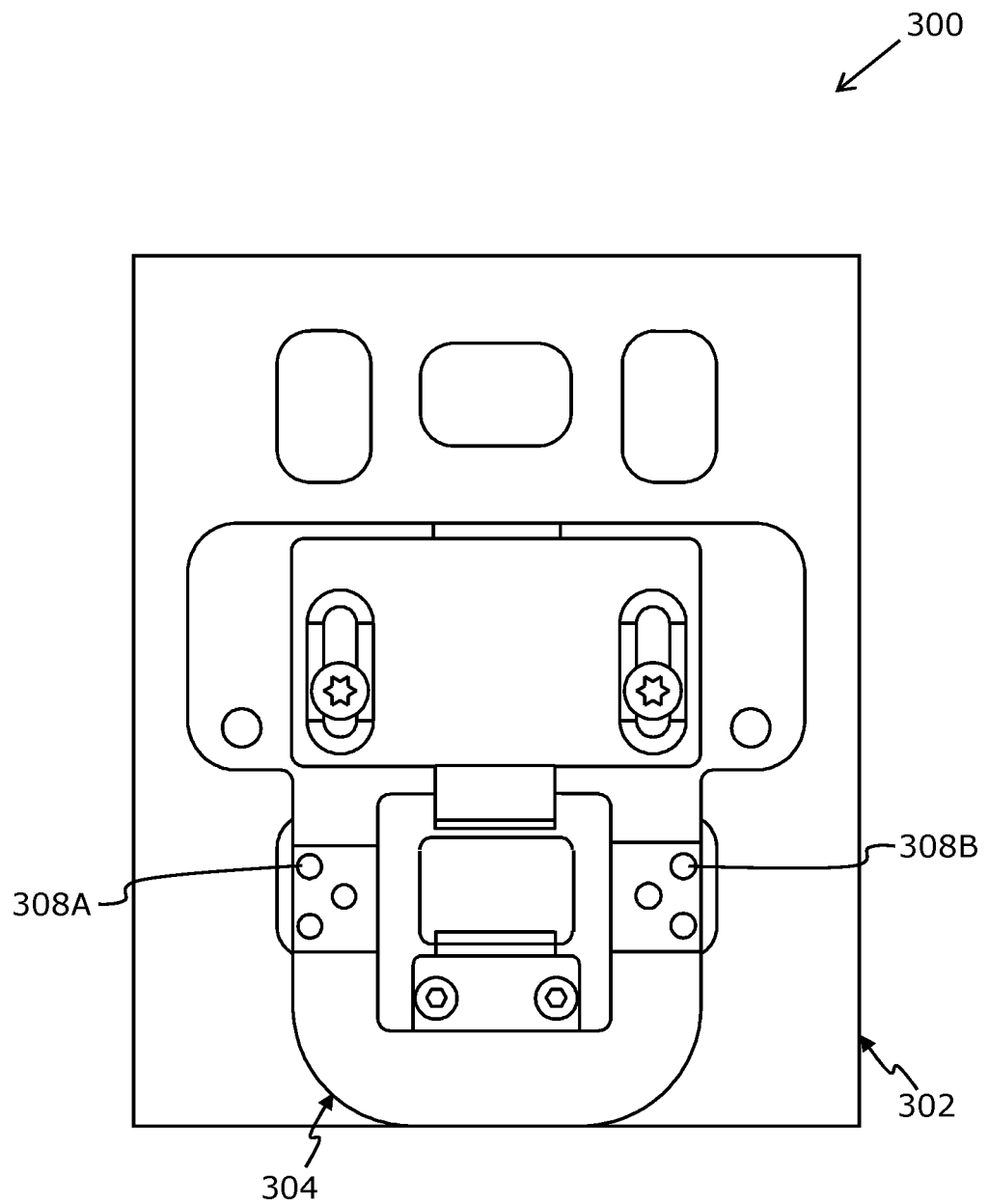
FIG. 3 illustrates a top view of apparatus for stacking of very short cavity laser diode arrays, in accordance with an embodiment of the present disclosure.

Referring to FIG. 3, there is shown a top view of apparatus 300 for stacking of very short cavity laser diode arrays, in accordance with an embodiment of the present disclosure. Herein, the apparatus 300 comprises a stacking plate 302 on which the array holder fixture 304 is placed.

Referring to FIG. 4, there is shown an apparatus 400 during stacking of very short cavity laser diode arrays, in accordance with an embodiment of the present disclosure. Herein, the apparatus 400 comprises a stacking plate 402. The array holder fixture 406 comprises a pair of side clamps 404A and 404B. The pair of side clamps 404A and 404B are detachably attached to sides of array holder fixture 406 with the help of screws 408A and 408B.

Figure 5A:
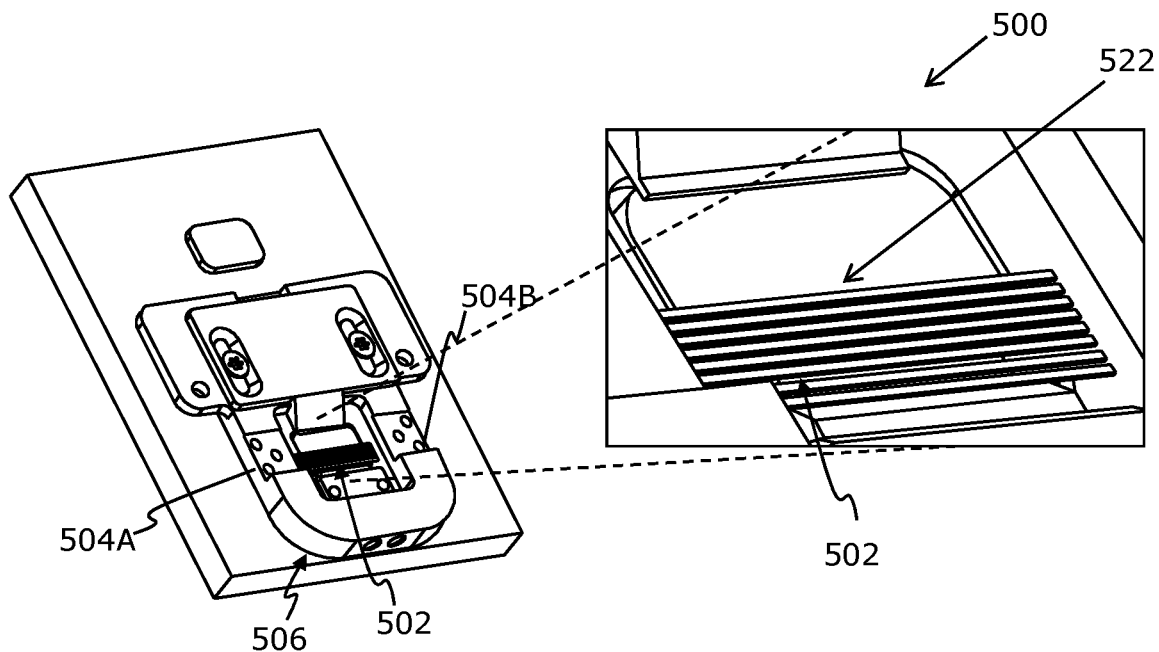
FIGS. 5A and 5B illustrate perspective views of apparatus in different stages of the stacking process of very short cavity laser diode arrays, in accordance with an embodiment of the present disclosure.
Figure 5B:
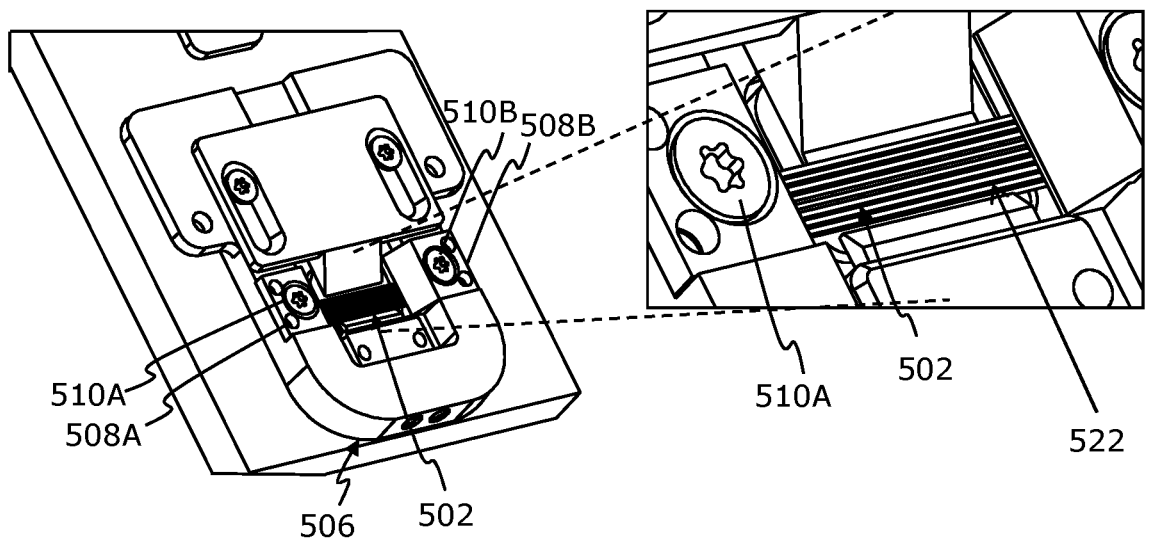

Referring to FIGS. 5A and 5B, illustrated are perspective views of the apparatus 500 in different stages of the stacking process of very short cavity laser diode arrays 502, in accordance with an embodiment of the present disclosure. In FIG. 5A, a plurality of empty spaces 504A and 504B is shown wherein a pair of side clamps (not shown in FIG. 5A) is attached after stacking of the very short cavity laser bars and spacer bars. The stack 522 of very short cavity laser diode arrays 502 are inserted in the array holder fixture 506. In FIG. 5B, the pair of side clamps 508A and 508B are detachably attached to sides of array holder fixture 506 with the help of screws 510A and 510B to secure the stack of very short cavity laser diode arrays 502.

Figure 6A:
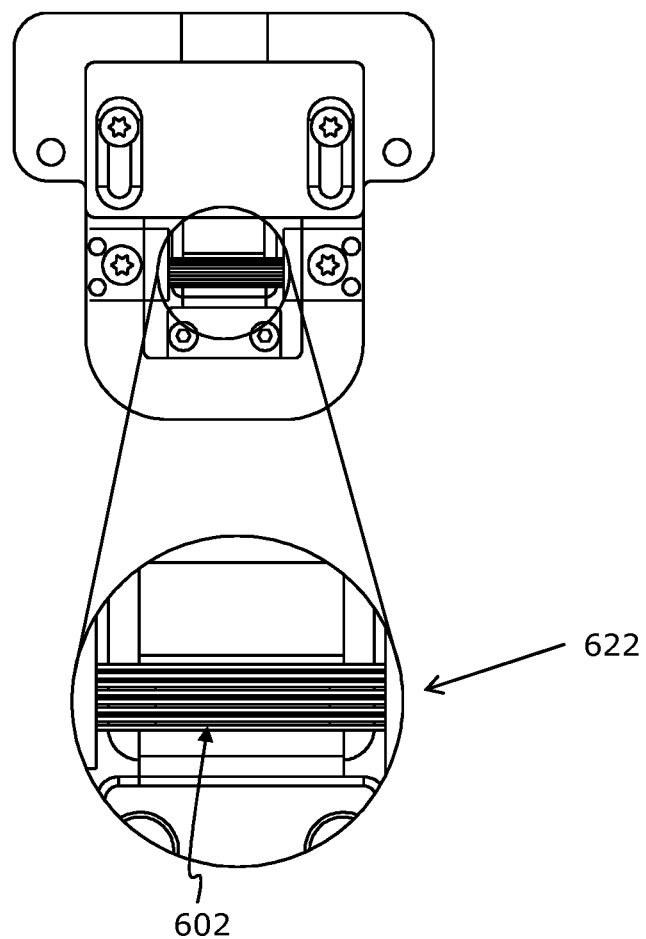
FIG. 6A illustrates an enlarged top view of the stack of very short cavity laser diode arrays, in accordance with an embodiment of the present disclosure.
Figure 6B:
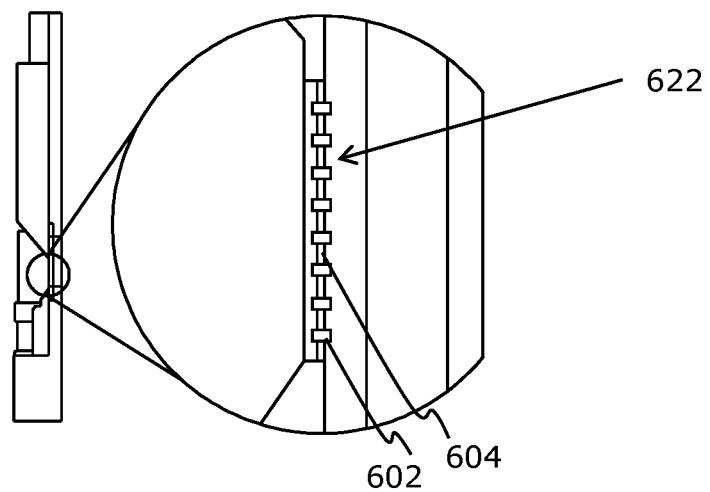
FIG. 6B illustrates an enlarged side view of the stack of very short cavity laser diode arrays, in accordance with an embodiment of the present disclosure.
Figure 6C:
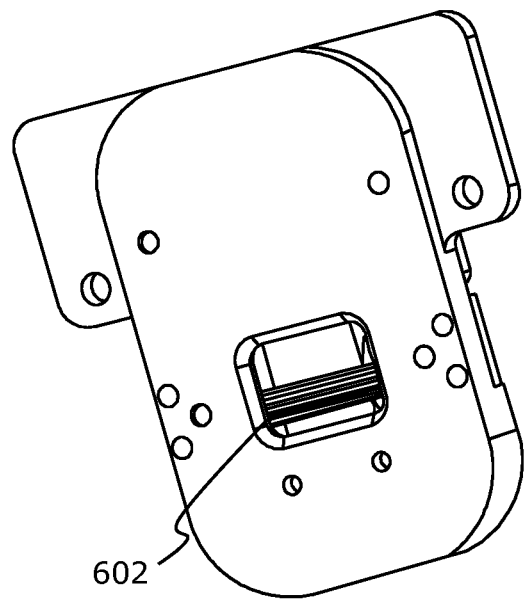
FIG. 6C illustrates a back view of the stack of very short cavity laser diode arrays, in accordance with an embodiment of the present disclosure.

Referring to FIG. 6A, there is shown an enlarged top view of the stack 622 of very short cavity laser diode arrays 602, in accordance with an embodiment of the present disclosure. In FIG. 6B, there is shown an enlarged side view of the stack 622 of very short cavity laser diode arrays 602. Herein, the spacer bars 604 are positioned on the stacking plate 202 to hold very short cavity laser diode arrays 602, that are positioned perpendicular to the stacking plate 202. In FIG. 6C, there is shown a back view of the stack 622 of very short cavity laser diode arrays 602.

Figure 7A:
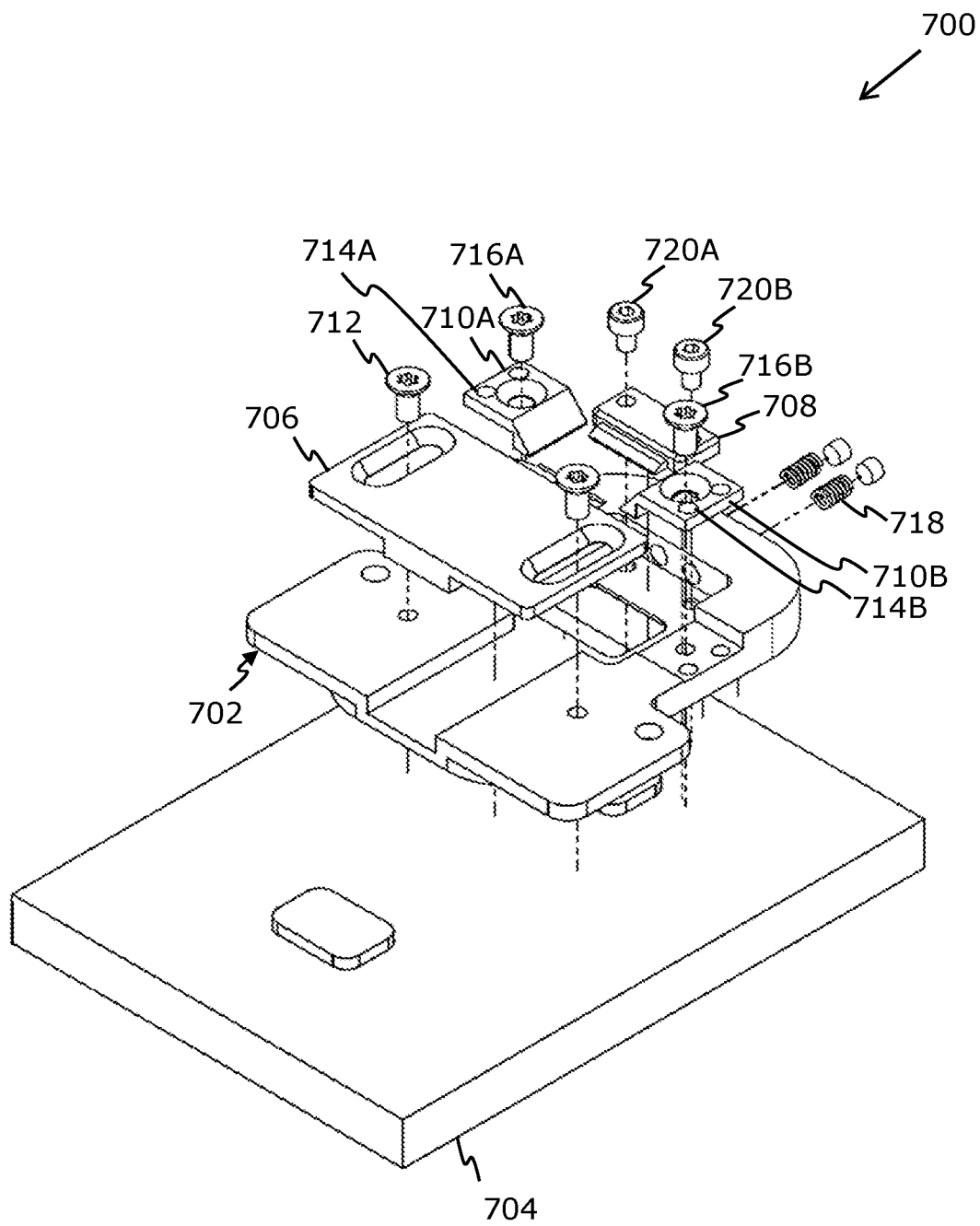
FIGS. 7A, 7B and 7C illustrate an exploded perspective view and an exploded side view of apparatus, in accordance with an embodiment of the present disclosure.
Figure 7B:
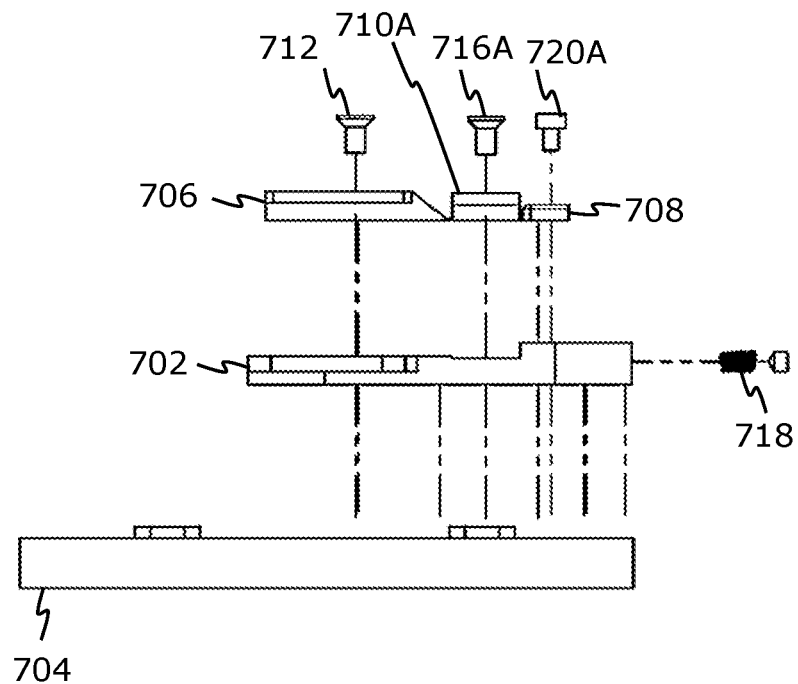
Figure 7C:
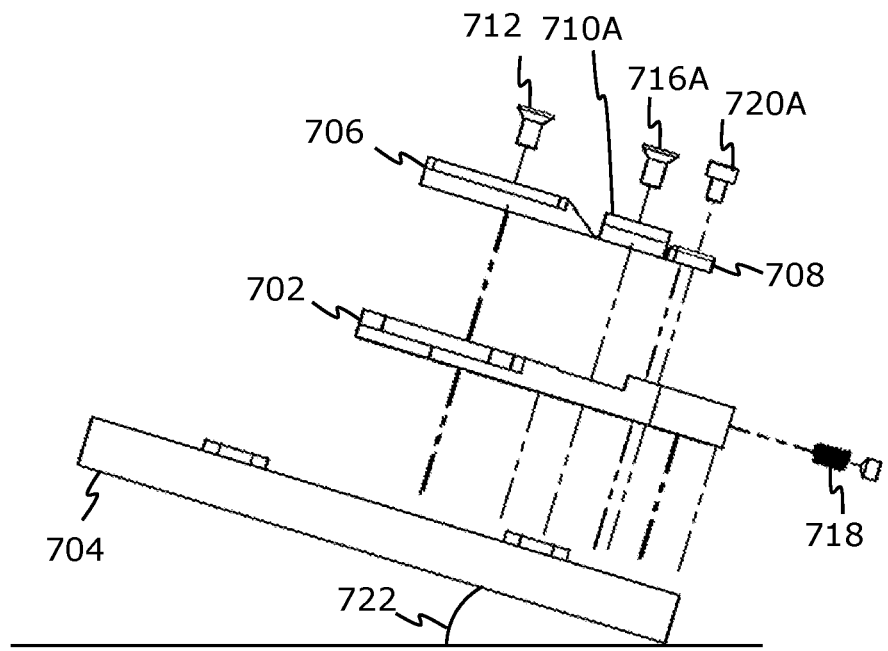

Referring to FIGS. 7A, 7B and 7C, there is shown an exploded view of apparatus 700 for stacking of very short cavity laser diode arrays, in accordance with an embodiment of the present disclosure. In FIG. 7A, there is shown an exploded perspective view of the apparatus 700. In FIG. 7B, there is shown an exploded side view of the apparatus 700. Herein, the apparatus 700 comprises an array holder fixture 702 and a stacking plate 704. The array holder fixture 702 comprises top-side presser 706, bottom-side presser 708 and a pair of side clamps 710A and 710B. The top-side presser 706 comprises presser screws 712. The pair of side clamps 710A and 710B are detachably attached to sides of the array holder fixture 702. The pair of side clamps 710A and 710B comprises a plurality of empty spaces 714A and 714B for insertion of metal rods. The pair of side clamps 710A and 710B are screwed in the array holder fixture 702 using screws 716A and 716B to secure a stack of very short cavity laser diode arrays. The bottom-side presser 708 comprises a plurality of cavities, wherein the plurality of cavities comprises small springs 718. The bottom-side presser 708 further comprises retaining screws 720A and 720B. In FIG. 7C, the apparatus 700 is shown to be slightly tilted by a small angle 722 to prevent the stack of very short cavity laser diode arrays and spacer bars from crashing.

Figure 8A:
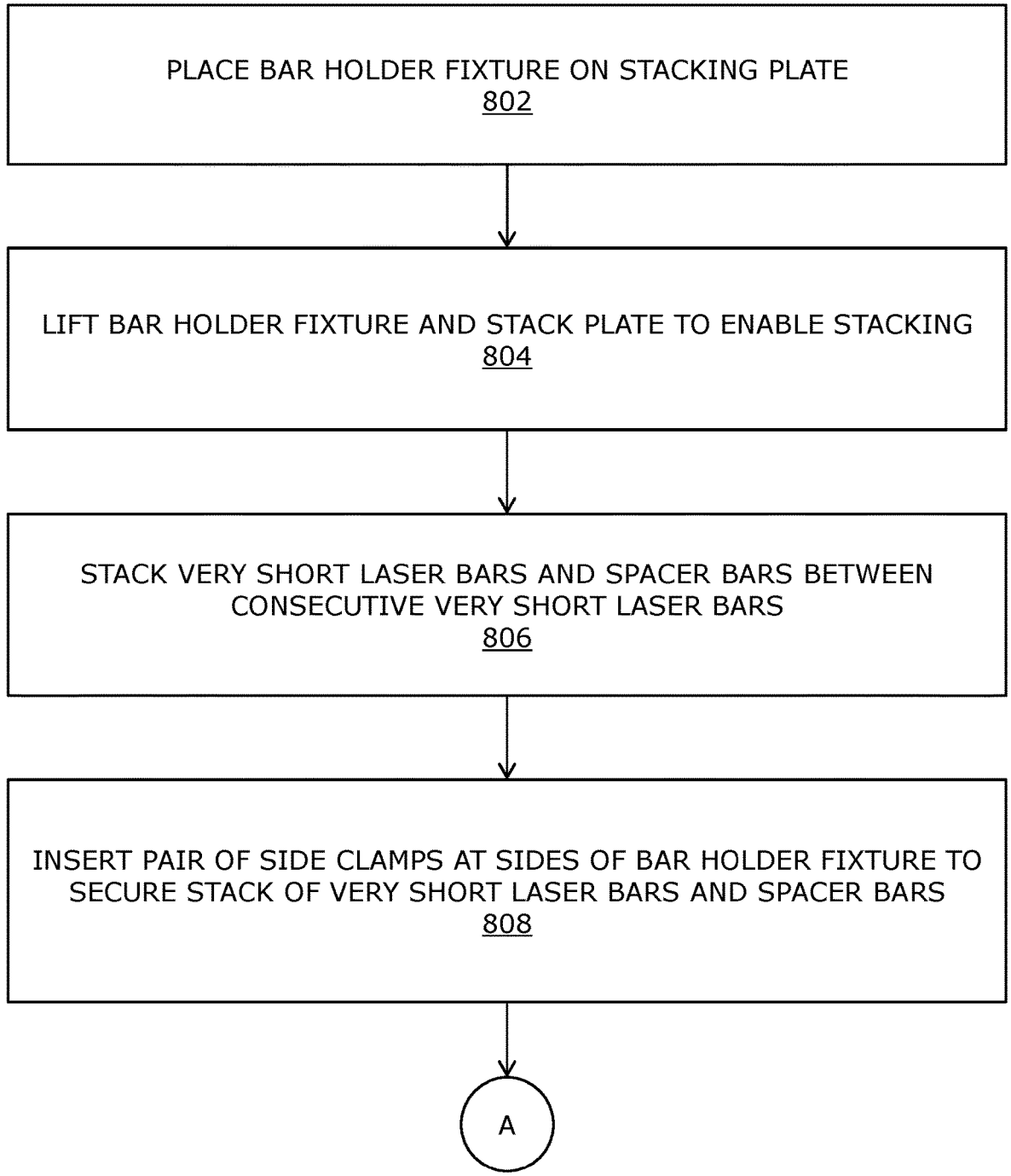
FIGS. 8A and 8B collectively illustrate a flowchart depicting steps of a method for stacking and coating of very short cavity laser diode arrays, in accordance with an embodiment in the present disclosure.
Figure 8B:
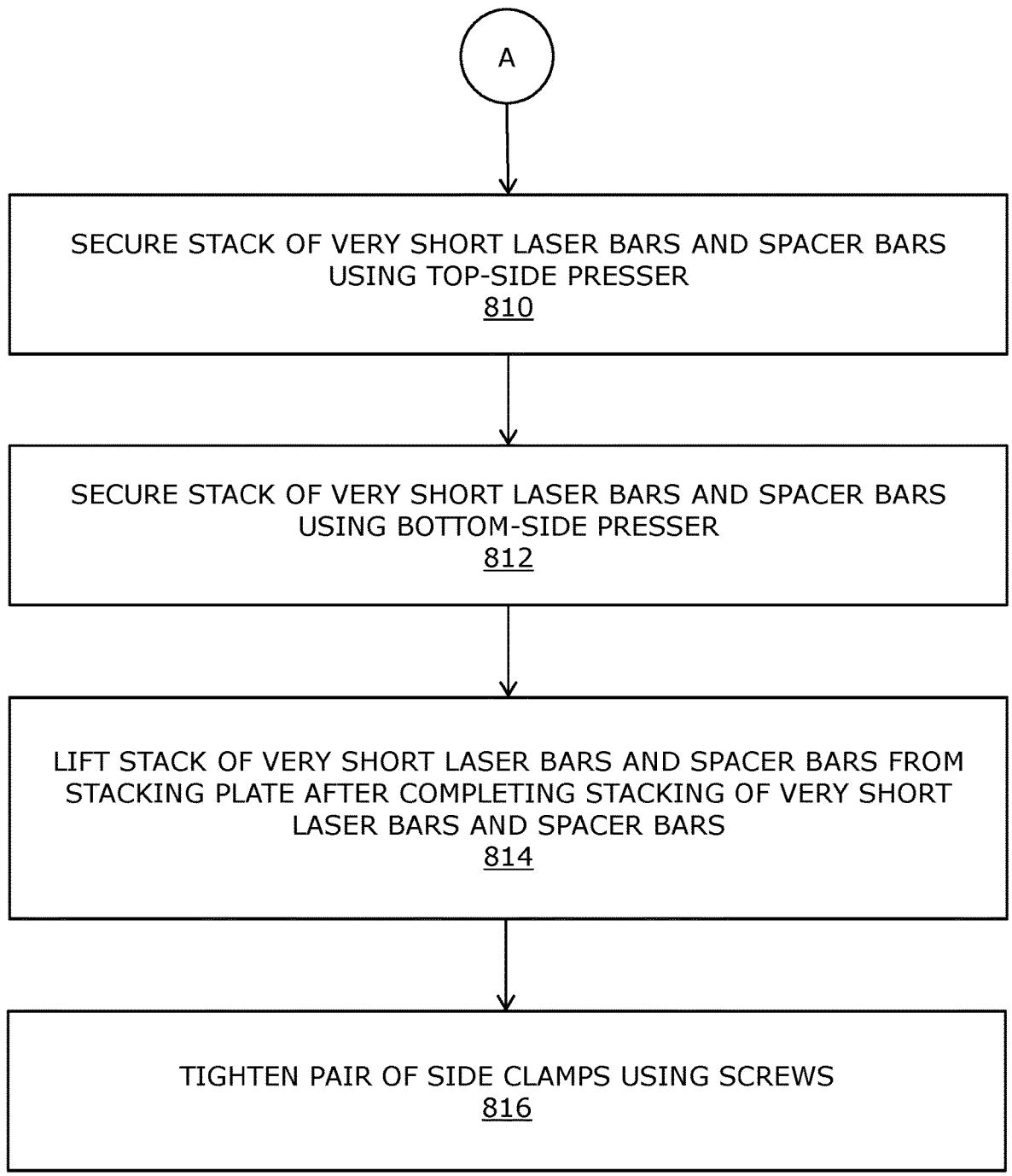

Referring to FIGS. 8A and 8B collectively illustrate a flowchart depicting steps of a method for stacking and coating of very short cavity laser diode arrays, in accordance with an embodiment in the present disclosure. At step 802, an array holder fixture is placed on a stacking plate. At step 804, the array holder fixture is lifted and the stacking plate to enable stacking. At step 806, the very short cavity laser diode arrays and spacer bars are stacked between consecutive very short cavity laser diode arrays. At step 808, a pair of side clamps are inserted at the sides of the array holder fixture to secure the stack of very short cavity laser diode arrays and spacer bars. At step 810, the stack of very short cavity laser diode arrays and spacer bars are secured using the top-side presser. At step 812, the stack of very short cavity laser diode arrays and spacer bars are secured using the bottom-side presser. At step 814, the stack of very short cavity laser diode arrays is lifted and spacer bars from the stacking plate after completing the stacking of very short cavity laser diode arrays and spacer bars. At step 816, the pair of side clamps is tightened after stacking of very short cavity laser diode arrays and spacer bars using screws.

Modifications to embodiments of the present disclosure described in the foregoing are possible without departing from the scope of the present disclosure as defined by the accompanying claims. Expressions such as "including", "comprising", "incorporating", "have", is used to describe and claim the present disclosure are intended to be construed in a non-exclusive manner, namely allowing for items, components or elements not explicitly described also to be present. Reference to the singular is also to be construed to relate to the plural.

The invention claimed is:

1. An apparatus for stacking and coating of very short cavity laser diode arrays, the apparatus comprising:
   an array holder fixture to securely hold the very short cavity laser diode arrays and spacer bars, the spacer bars being disposed between consecutive very short cavity laser diode arrays, the array holder fixture comprising:
      a top-side presser to secure a stack of very short cavity laser diode arrays and spacer bars from a first end of the stack,
      a bottom-side presser to secure the stack of very short cavity laser diode arrays and spacer bars from a second end of the stack, and
      a pair of side clamps detachably attached to sides of the array holder fixture, wherein the pair of side clamps are attached after stacking of the very short cavity laser diode arrays and the spacer bars; and
   a stacking plate, wherein the array holder fixture is operatively coupled to the stacking plate during the stacking of the very short cavity laser diode arrays and spacer bars, wherein the very short cavity laser diode arrays are positioned perpendicular to the stacking plate.

2. The apparatus of claim 1, wherein the array holder fixture and the stacking plate are liftable by an angle to insert the very short cavity laser diode arrays and the spacer bars.

3. The apparatus of claim 1, wherein the stacking plate comprises a pair of pedestals having varying heights to align the array holder fixture thereon.

4. The apparatus of claim 1, wherein a plurality of empty spaces are present on the pair of side clamps.

5. A method for stacking and coating of very short cavity laser diode arrays using an apparatus comprising:
   an array holder fixture to securely hold the very short cavity laser diode arrays and spacer bars, the array holder fixture comprising:
   a top-side presser to secure a stack of very short cavity laser diode arrays and spacer bars from a first end of the stack;
   a bottom-side presser to secure the stack of very short cavity laser diode arrays and spacer bars from a second end of the stack; and
   a pair of side clamps detachably attached to sides of the array holder fixture, wherein the pair of side clamps are attached after stacking of the very short cavity laser diode arrays and the spacer bars;

a stacking plate, wherein the array holder fixture is operatively coupled to the stacking plate during the stacking of the very short cavity laser diode arrays and spacer bars, wherein the very short cavity laser diode arrays are positioned perpendicular to the stacking plate; and wherein the method comprises:

placing an array holder fixture on the stacking plate;

lifting the array holder fixture and the stacking plate to enable stacking;

stacking the very short cavity laser diode arrays and spacer bars, wherein a spacer bar is disposed between consecutive very short cavity laser diode arrays of the stack;

inserting a pair of side clamps at the sides of the array holder fixture to secure sides of the stack;

securing a top of the stack using the top-side presser;

securing a bottom of the stack using the bottom-side presser;

lifting the stack from the stacking plate after completing the stacking of the very short cavity laser diode arrays and spacer bars; and tightening the pair of side clamps using screws.

6. The method of claim 5, wherein the method comprises lifting the array holder fixture and the stacking plate by an angle to insert the very short cavity laser diode arrays and the spacer bars.

7. An apparatus for stacking and coating of very short cavity laser diode arrays, the apparatus comprising:

an array holder fixture to securely hold the very short cavity laser diode arrays and spacer bars, the spacer bars being disposed between consecutive ones of the very short cavity laser diode arrays, the array holder fixture comprising:

a top-side presser to secure a stack of very short cavity laser diode arrays and spacer bars from a first end of the stack, a bottom-side presser to secure the stack of very short cavity laser diode arrays and spacer bars from a second end of the stack, and a pair of side clamps detachably attached to sides of the array holder fixture, wherein the pair of side clamps are attached after stacking of the very short cavity laser diode arrays and the spacer bars and wherein a plurality of empty spaces are present on the pair of side clamps for insertion of metal rods therein, wherein the metal rods guide the pair of side clamps into place during the stacking; and a stacking plate, wherein the array holder fixture is operatively coupled to the stacking plate during the stacking of the very short cavity laser diode arrays and spacer bars.

8. The apparatus of claim 7, wherein the array holder fixture and the stacking plate are liftable by an angle to insert the very short cavity laser diode arrays and the spacer bars.

9. The apparatus of claim 7, wherein the spacer bars are arranged on the stacking plate to hold the very short cavity laser diode arrays, then very short cavity laser diode arrays being positioned perpendicular to the stacking plate.

10. The apparatus of claim 7, wherein the stacking plate comprises a pair of pedestals having varying heights to align the array holder fixture thereon.

* * * * *